(12) United States Patent
Yaung

(10) Patent No.: US 7,262,400 B2
(45) Date of Patent: Aug. 28, 2007

(54) IMAGE SENSOR DEVICE HAVING AN ACTIVE LAYER OVERLYING A SUBSTRATE AND AN ISOLATING REGION IN THE ACTIVE LAYER

(75) Inventor: Dun-Nian Yaung, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/292,626

(22) Filed: Dec. 2, 2005

(65) Prior Publication Data
US 2007/0125935 A1    Jun. 7, 2007

(51) Int. Cl.
*H01L 27/00* (2006.01)
*H01L 31/00* (2006.01)

(52) U.S. Cl. .................................. 250/208.1; 257/452

(58) Field of Classification Search ............. 250/208.1, 250/226, 214.1; 257/446, 452
See application file for complete search history.

(56) References Cited

U.S. PATENT DOCUMENTS

| | | | | |
|---|---|---|---|---|
| 4,878,120 A | * | 10/1989 | Matsumoto et al. | 348/307 |
| 6,177,333 B1 | * | 1/2001 | Rhodes | 438/433 |
| 6,204,087 B1 | * | 3/2001 | Parker et al. | 438/56 |
| 6,483,163 B2 | * | 11/2002 | Isogai et al. | 257/446 |
| 6,653,164 B2 | * | 11/2003 | Miida | 438/57 |
| 6,806,904 B1 | * | 10/2004 | Kim | 348/315 |
| 2004/0180461 A1 | * | 9/2004 | Yaung et al. | 438/48 |

* cited by examiner

*Primary Examiner*—Thanh X. Luu
(74) *Attorney, Agent, or Firm*—Thomas, Kayden, Horstemeyer & Risley

(57) ABSTRACT

An image sensing device. An active layer is disposed overlying a substrate, wherein the active layer has different conductivity with the substrate. A plurality of photodiodes is disposed in the active layer. An isolating region is interposed between two adjacent photodiodes, wherein the isolating region contacts the substrate.

15 Claims, 11 Drawing Sheets

IMAGE SENSOR DEVICE HAVING AN ACTIVE LAYER OVERLYING A SUBSTRATE AND AN ISOLATING REGION IN THE ACTIVE LAYER

BACKGROUND

The invention relates to an electronic device, and more particularly, to an image sensor device.

Solid state image sensors are necessary components in many optoelectronic devices, including digital cameras, cellular phones, and others. Conventional solid-state image sensors for color analog or digital video cameras comprise typically charge-coupled devices (CCD) or complementary metal oxide semiconductor (CMOS) photodiode array structures which comprise a spectrally photosensitive layer below one or more layers patterned in an array of color filters and above which resides a surface-layer array of microlens elements. The elementary unit of the image sensor is defined as a pixel. The basic technology used to form the CMOS image sensor is common to both sensor types.

The CMOS image sensor comprises a photo detector detecting light and a logic circuit converting the detected light into an electric signal representing data regarding the detected light. The fill factor, sometimes referred to as the aperture efficiency, is the ratio of the size of the light-sensitive area to the size of the total pixel. Although efforts have been made to increase the fill factor of an image sensor and thereby increase sensor sensitivity, further increases in the fill factor are limited because the associated logic circuitry cannot be completely removed. To increase the sensitivity of the light, microlens formation technology has been used to converge and focus incident light onto a photo detector by changing the path of the light to the lens of the photo detector. For the image sensor to detect and provide a color image, it typically must employ both a photo detector receiving the light and generating and accumulating charge carriers and a color filter array (CFA), i.e., a plurality of color filter units sequentially arranged above the photo detector. The CFA typically uses one of two alternative three-color primary configurations, either red R, green G and blue B (RGB) configuration or one of yellow Y, magenta M and cyan C (CMY). A plurality of microlenses are positioned above the color filter array to increase the photo-sensitivity of the image sensor.

FIG. 1 is a cross section illustrating a typical image sensor device. In FIG. 1, a typical image sensor device 100 is illustrated in cross section, including a semiconductor substrate 101 having an array of photodiodes 120 therein. Each photodiode 120 has, for example, an n-type region 124 in a p-type region 122. Each photodiode 120 is separated from others by an array of isolation structures 110, such as shallow trench isolation (STI). Thus, an array of pixels is obtained. The pixels convert incoming light 160 from a light/image source to electrical signals via the photodiodes 124. The substrate 101 is covered by a series of dielectric layers 130, such as interlevel dielectric (ILD) layers and intermetal dielectric (IMD) layers. A color filter layer 140 overlying the substrate 101 includes red regions 140a, green regions 140b and blue regions 140c. In this image sensor device, however, electrons in a pixel are likely to pass to neighboring pixels through the substrate thereunder. This phenomenon is referred as electric crosstalk. Specifically, as pixel size is reduced, electric crosstalk increases. In addition, conventional image sensor cannot provide uniform sensitivity to the three major colors.

SUMMARY

An embodiment of the invention provides an image sensing device. An active layer is disposed overlying a substrate, wherein the active layer has different conductivity from the substrate. A plurality of photodiodes is disposed in the active layer. An isolating region is interposed between two adjacent photodiodes, contacting the substrate.

Also provided is an image sensing device. An active layer is disposed overlying a substrate, wherein the active layer has different conductivity with the substrate. A photodiode is disposed in the active layer. An isolating region surrounds the photodiode, contacting the substrate.

Further provided is a method for forming an image sensing devices. An active layer is formed on a substrate, presenting different conductivity therefrom. A plurality of isolating regions are formed in the active layer and contact the substrate to isolate and define corresponding pixels. A doping region is formed in each pixel to generate a photodiode.

Further scope of applicability of the invention will become apparent from the detailed description given hereinafter. However, it should be understood that the detailed description and specific examples, while indicating embodiments of the invention, are given by way of illustration only, since various changes and modifications within the spirit and scope of the invention will become apparent to those skilled in the art from this detailed description.

DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
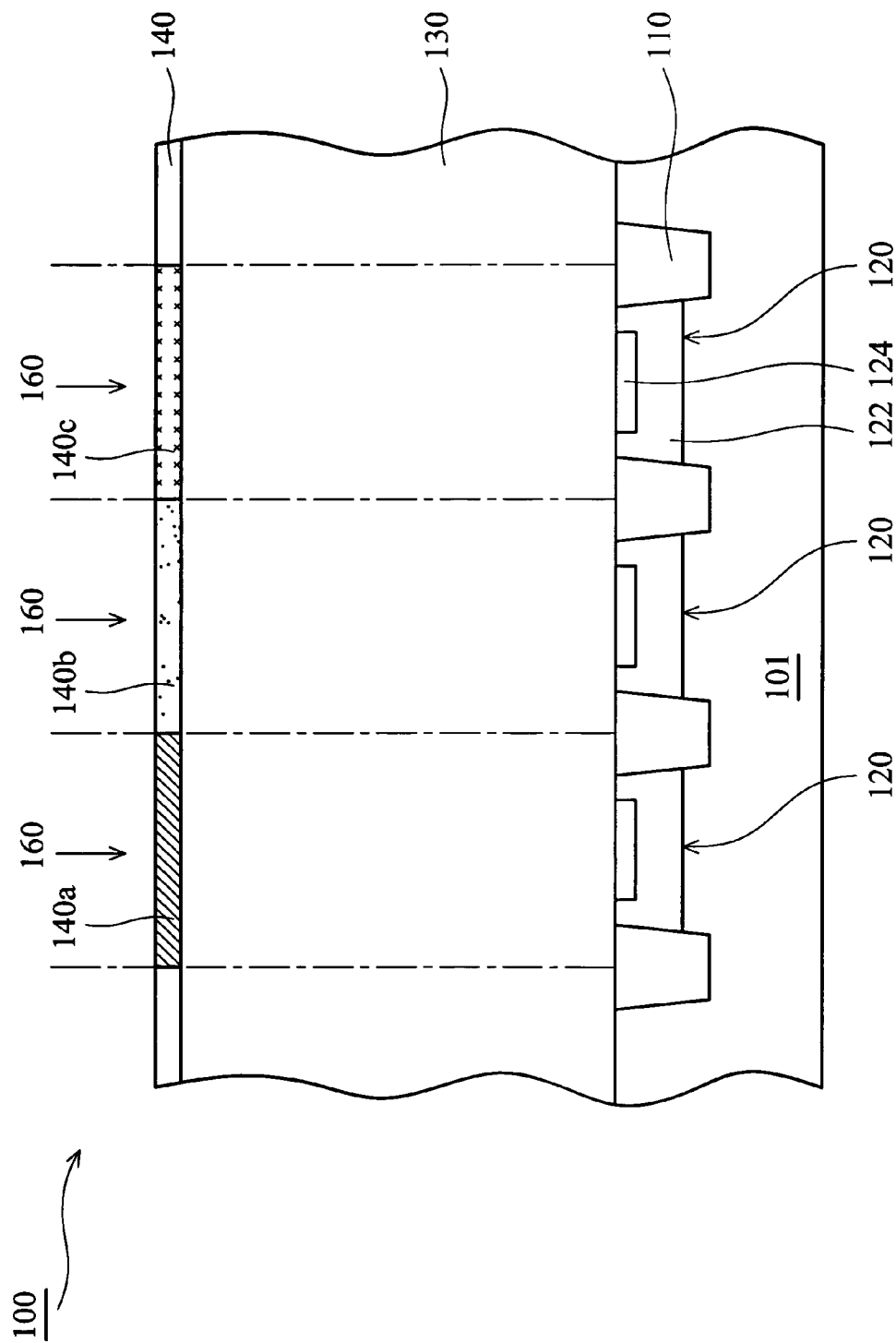
FIG. 1 is a cross section illustrating a typical image sensor device.

Embodiments of the invention, which provides an image sensor, will be described in greater detail by referring to the drawings that accompany the invention. It is noted that in the accompanying drawings, like and/or corresponding elements are referred to by like reference numerals.

Figure 2A:
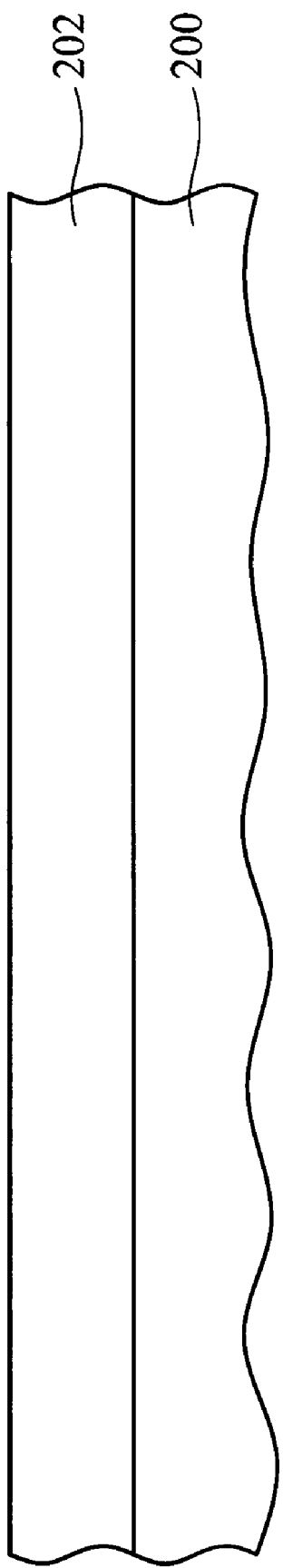
FIGS. 2A~2G illustrate a method for fabricating an image sensor in accordance with an embodiment of the invention.

FIGS. 2A~2G illustrate a method for fabricating an image sensor in accordance with an embodiment of the invention. As shown in FIG. 2A, a substrate 200 is provided and an active layer 202 formed overlying the substrate 200. The substrate 200 may use an elementary semiconductor such as crystal silicon, polycrystalline silicon, germanium, or diamond, a compound semiconductor such as silicon carbide, gallium arsenic, or an alloy semiconductor such as SiGe, GaAsP, AlInAs, AlGaAs, GaInP, or any combination thereof. Furthermore, the substrate 200 is not limited to semiconductor substrate, that is can be a glass substrate. Preferably, the substrate 200 is silicon substrate, and more preferably comprises high concentration dopants, such as $10^{18} \sim 10^{19}$ atoms/cm$^3$.

There may be an insulating layer (not shown) between the substrate and the active layer. In one embodiment, the insulator layer may be buried oxide (BOX) layer, such as that formed by separation by implantation of oxygen (SIMOX) technology. The insulating layer can be formed on the substrate by thermal oxidation, atomic layer deposition (ALD), chemical vapor deposition (CVD), physical vapor deposition (PVD) and/or other process. Chemical mechanical polishing (CMP) and/or other methods may be employed to attain a desired thickness of the insulating layer. Moreover, although not limited by the scope of the present disclosure, the insulator layer may include oxide, silicon oxide, silicon nitride, silicon oxynitride, low k material, air gap, combination thereof, and/or other materials.

The active layer 202 overlying the substrate 200 may be an epitaxy layer or a wafer bonding layer. The active layer 202 may be formed by liquid phase epitaxy, vapor phase epitaxy, metal-organic chemical vapor deposition, molecular beam epitaxy, and/or other epitaxy methods. Preferably, the active layer 202 is a silicon layer with low concentration doping, such as $10^{13}$~$10^{16}$ atoms/cm3. In a preferred embodiment of the invention, the substrate 200 is a P+ silicon substrate, and the active layer 202 overlying the substrate 200 comprises P− silicon. The active layer 202 has a preferred thickness exceeding about 3 μm when the substrate 200 is heavily doped, and exceeding about 2 μm when an insulating layer is interposed therebetween.

Figure 2B:
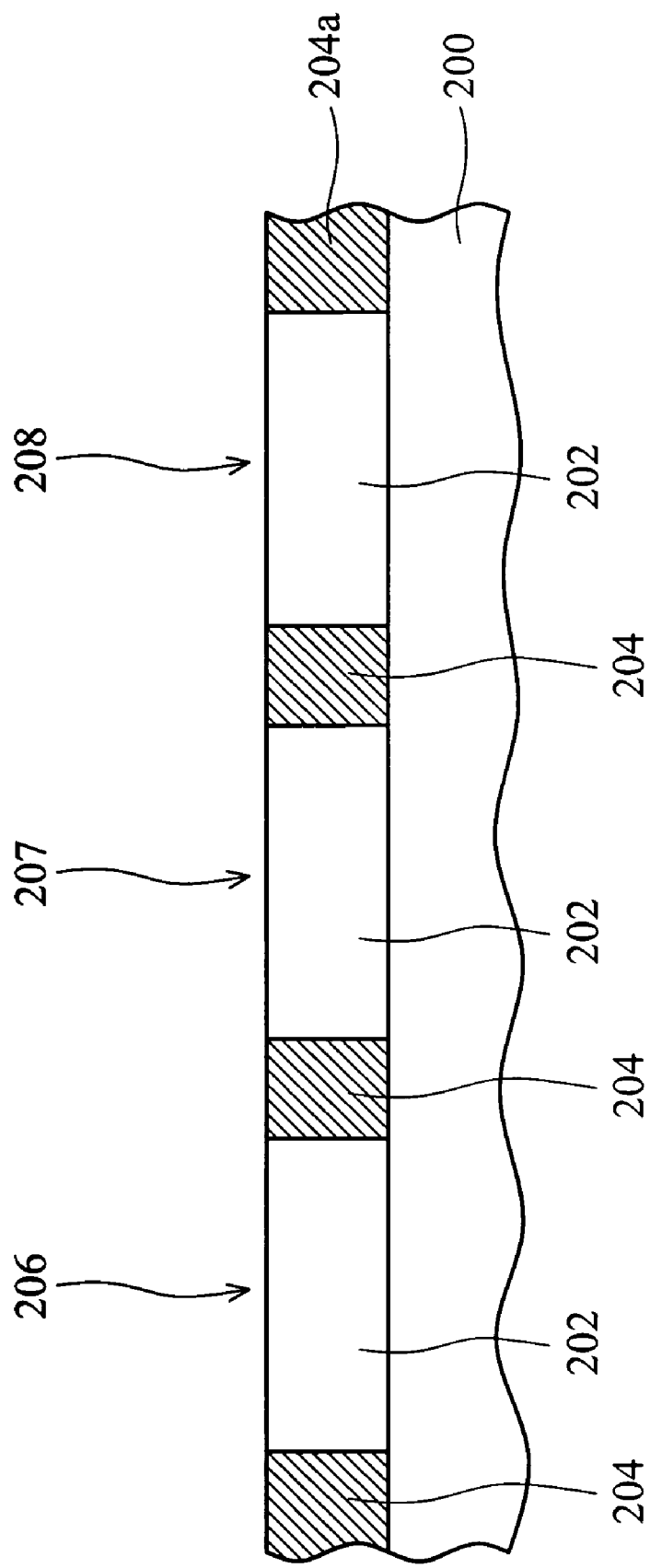
Figure 2B:
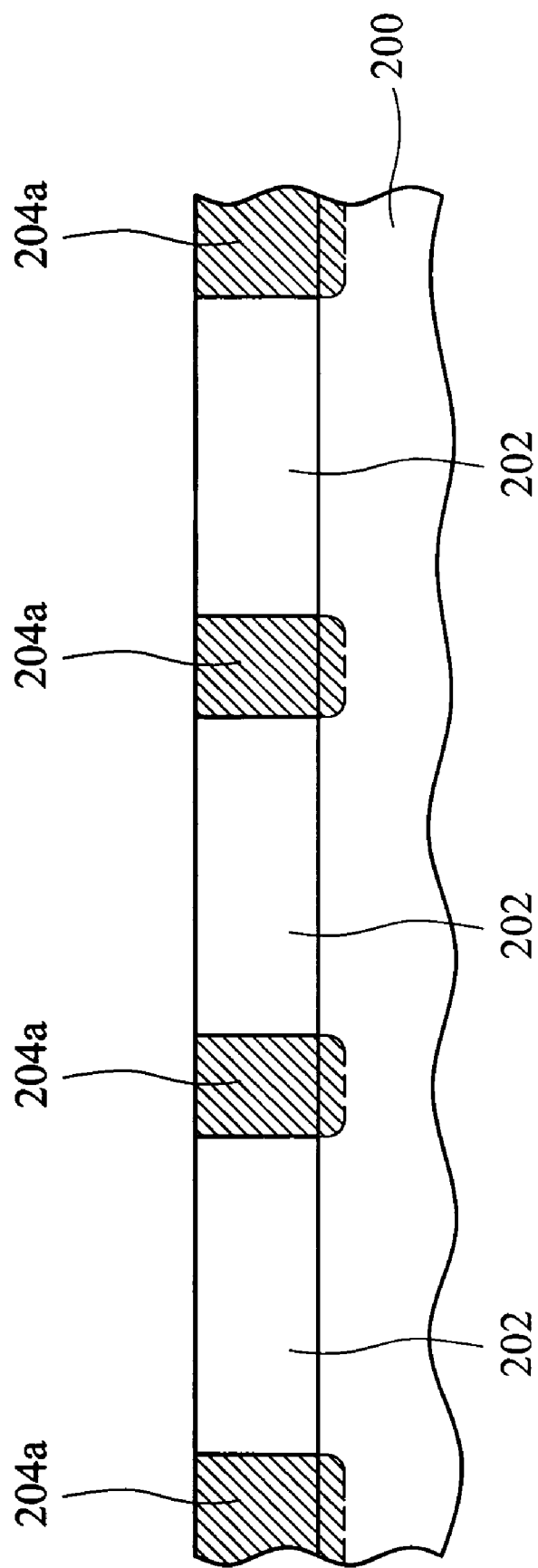

As shown in FIG. 2B, an isolating region 204 is formed in the active layer 202 to define and isolate pixels 206, 207 and 208 of three major colors. The isolating region 204 contacts the substrate 200. As shown in FIG. 2B', in an alternative embodiment, the isolating region 204a extends into the substrate 200. The isolating region 204 surrounding the pixels 206, 207 and 208 can be formed by ion implantation and/or diffusion using patterned photoresist layer and/or hard mask as a mask. The ion implantation described can be a typical implantation method or plasma source ion implantation (PSII). The ion source can be B or In. Preferably, the isolating region 204 comprises P+ silicon, and more preferably has doping of about $10^{15}$~$10^{17}$ atoms/cm$^3$.

Figure 2C:
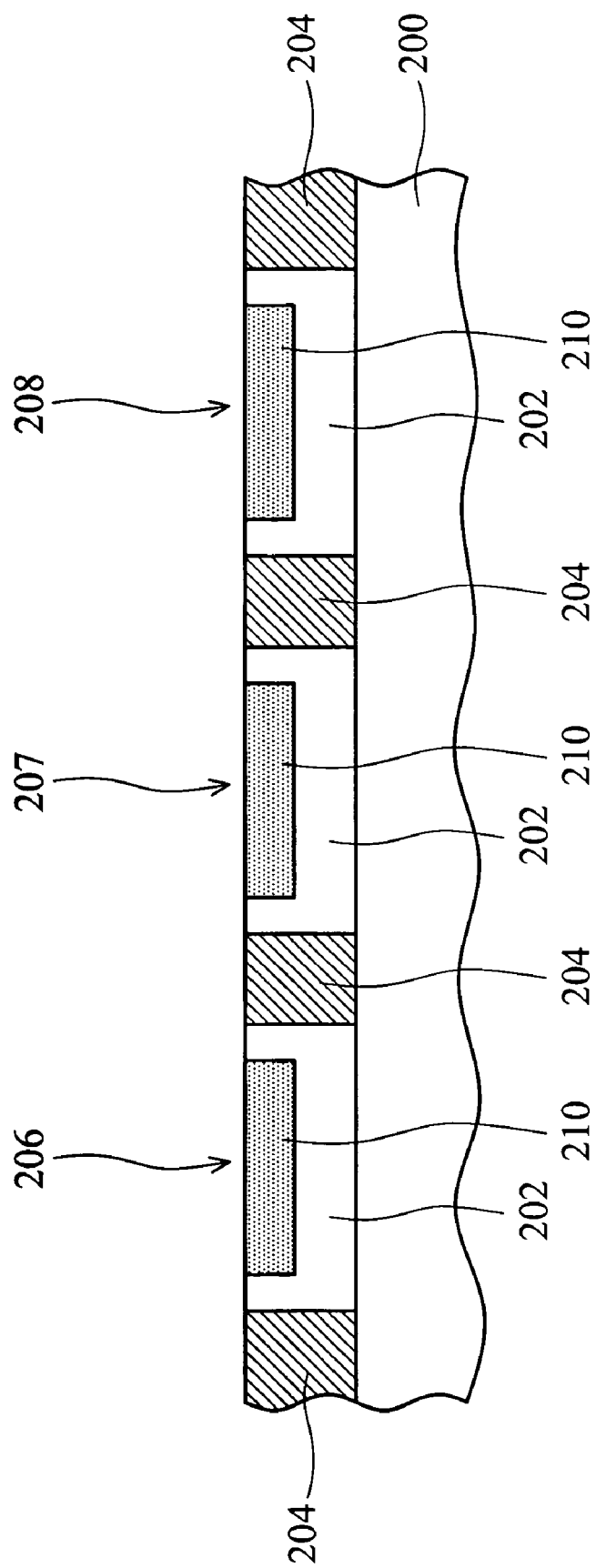

Next, as shown in FIG. 2C, a doping region 210 is formed in each pixel to generate a photodiode. The doping region 210 has a reverse doping type from the active layer 202. In the embodiment, the doping region 210 is n type, and can also be formed by ion implantation using patterned photoresist layer and/or hard mask, in which As or P can be used as ion sources. Preferably, the doping region 210 is separated from the isolating region 204 by about 0.1~0.2 μm to prevent leakage from misalignment.

Figure 2D:
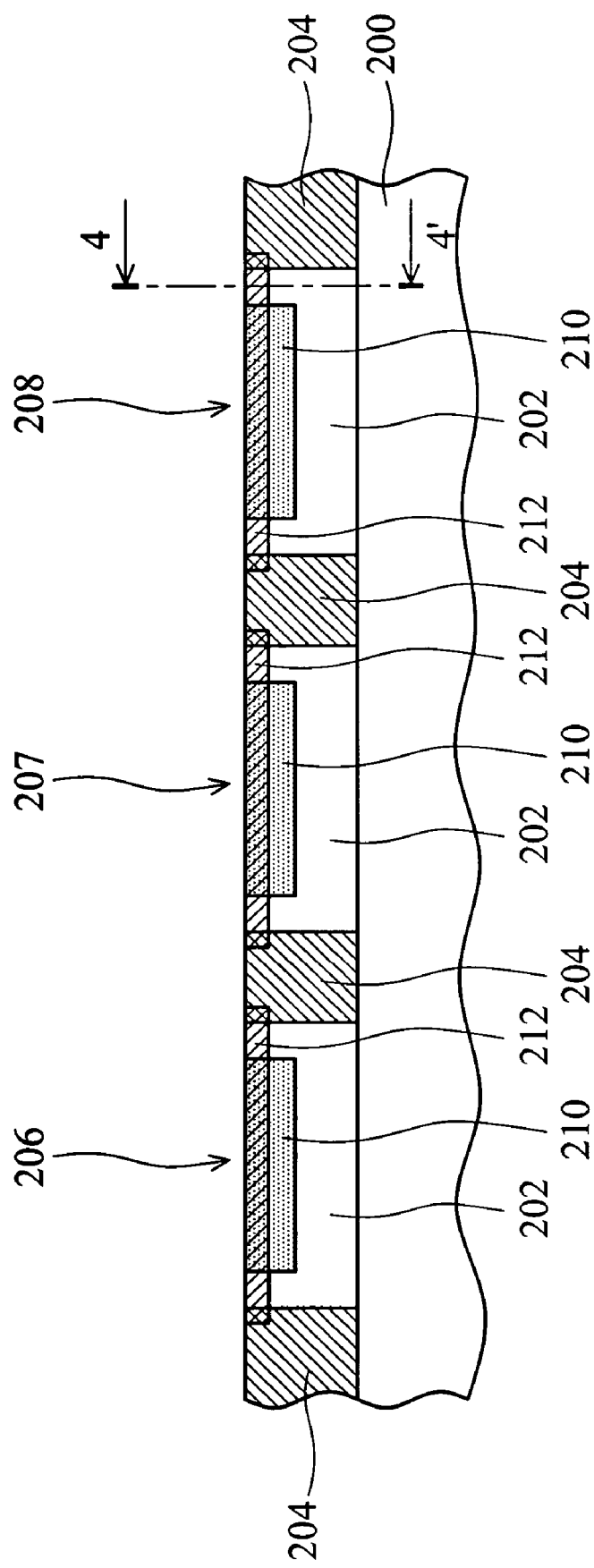

Referring to FIG. 2D, pinned layers 212 are formed in the active layer 202 corresponding to the pixels 206, 207 and 208 of three major colors. In an embodiment, the pinned layers 212 extend into the isolating regions 204, preferably having the same voltage potential as the isolating regions 204 and the substrate 200 to reduce dark currents from the surface of the active layer. Dark current is minimized by providing a p-type pinned layer 212 at the surface that pins the potential of the surface to the potential of the substrate 200, typically the ground level or 0 volts. This suppresses dark current generation in interface states. Dark current suppression improves the signal to noise ratio of the photo sensor by lowering the noise electron generation rate compared to the photo-electron generation rate.

Figure 4:
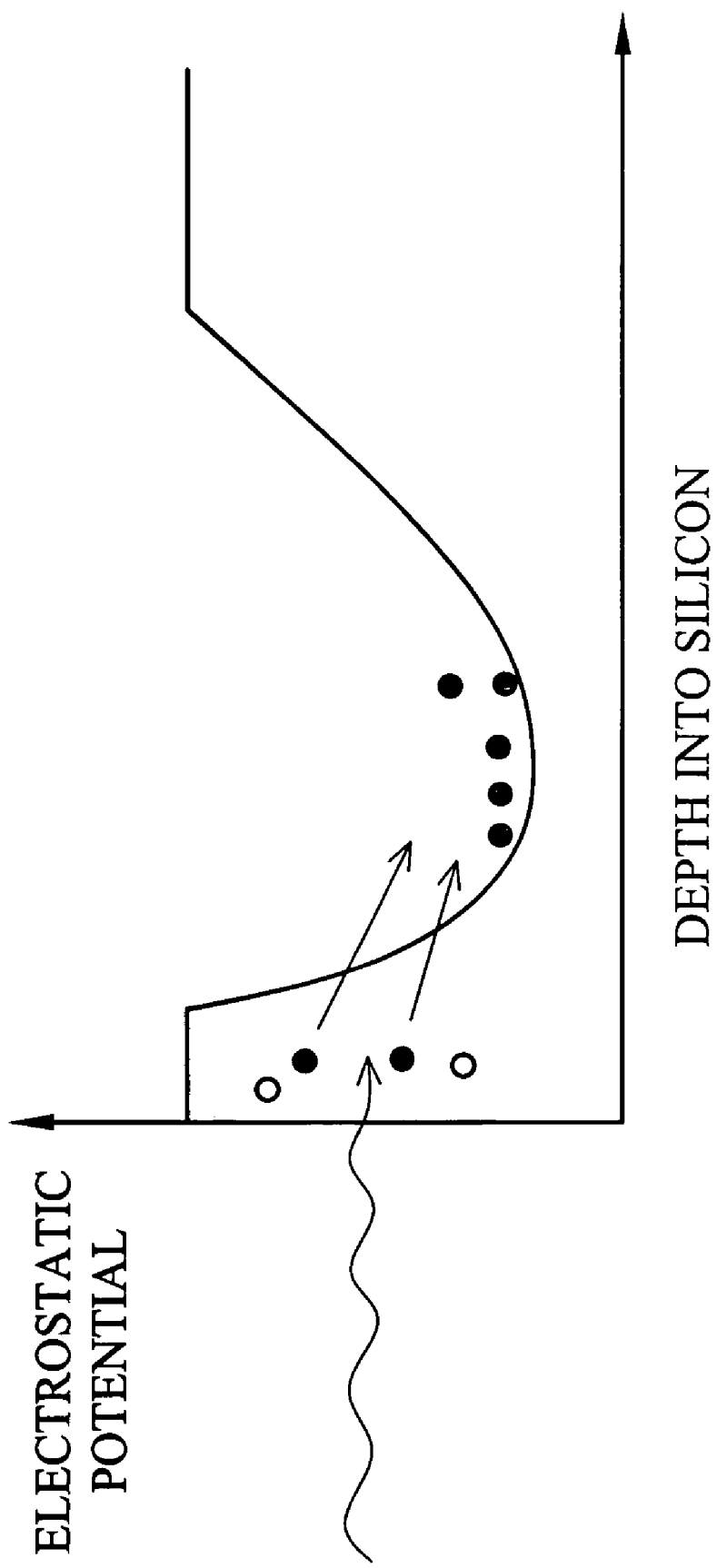
FIG. 4 is an illustration of the electrostatic potential profile of the pinned photodiode shown in FIG. 2D along the line 4-4'.

FIG. 4 is an illustration of the electrostatic potential profile of the pinned photodiode shown in FIG. 2D along the line 4-4'. As shown in FIG. 4, electrostatic potential of blue light is adjacent to the surface of the photodiode. Pinning the surface potential of the photodiode also improves blue quantum efficiency by providing an electric field that pulls photo-electrons generated at the surface into the electrostatic potential well of the pinned photodiode. This is depicted in FIG. 4. Blue quantum efficiency is also improved by reducing the recombination of shallow photo-electrons through suppression of interface states.

Figure 2E:
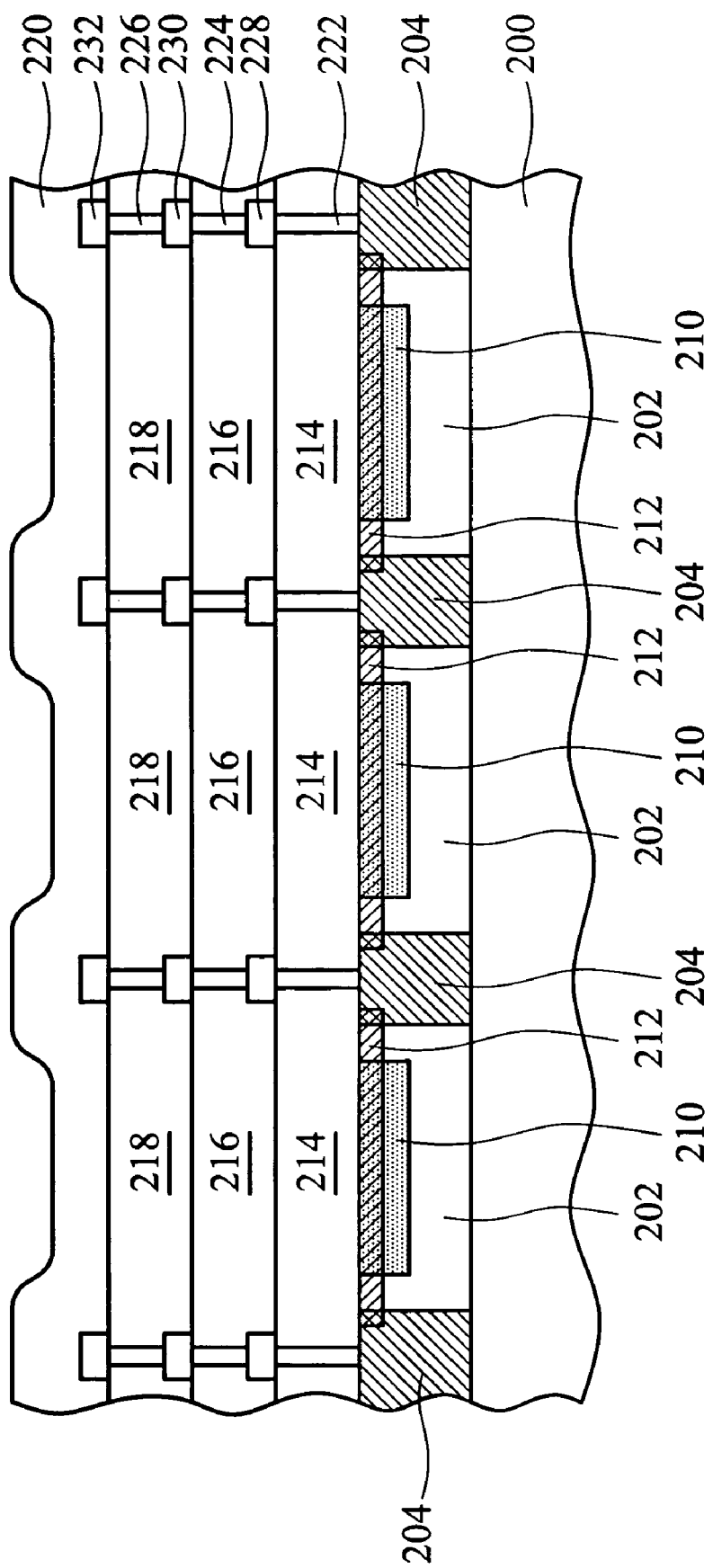

Next, referring to FIG. 2E, the photodiodes are covered by a series of dielectric layers 214, 216 and 218, such as an interlevel dielectric (ILD) layer, intermetal dielectric (IMD) layers, and a passivation layer 220. Dielectric layers 214, 216, 218, 220 comprise a silicon oxide layer, a silicon nitride layer, a silicon oxynitride layer, or spin-on materials. Each dielectric layer has a thickness of approximately 0.2 to 1.5 μm. The thickness of the silicon oxide layer is preferably thinner than about 4.5 μm. The thickness of the silicon nitride layer is preferably less than approximately 0.5 μm. Further, a multi-layer interconnect is disposed in the dielectric layer. Typically, via plugs 222, 224, and 226 and metal lines 228, 230 and 232 are formed in the IMD layers 216, 218 and passivation layer 220.

Figure 2F:
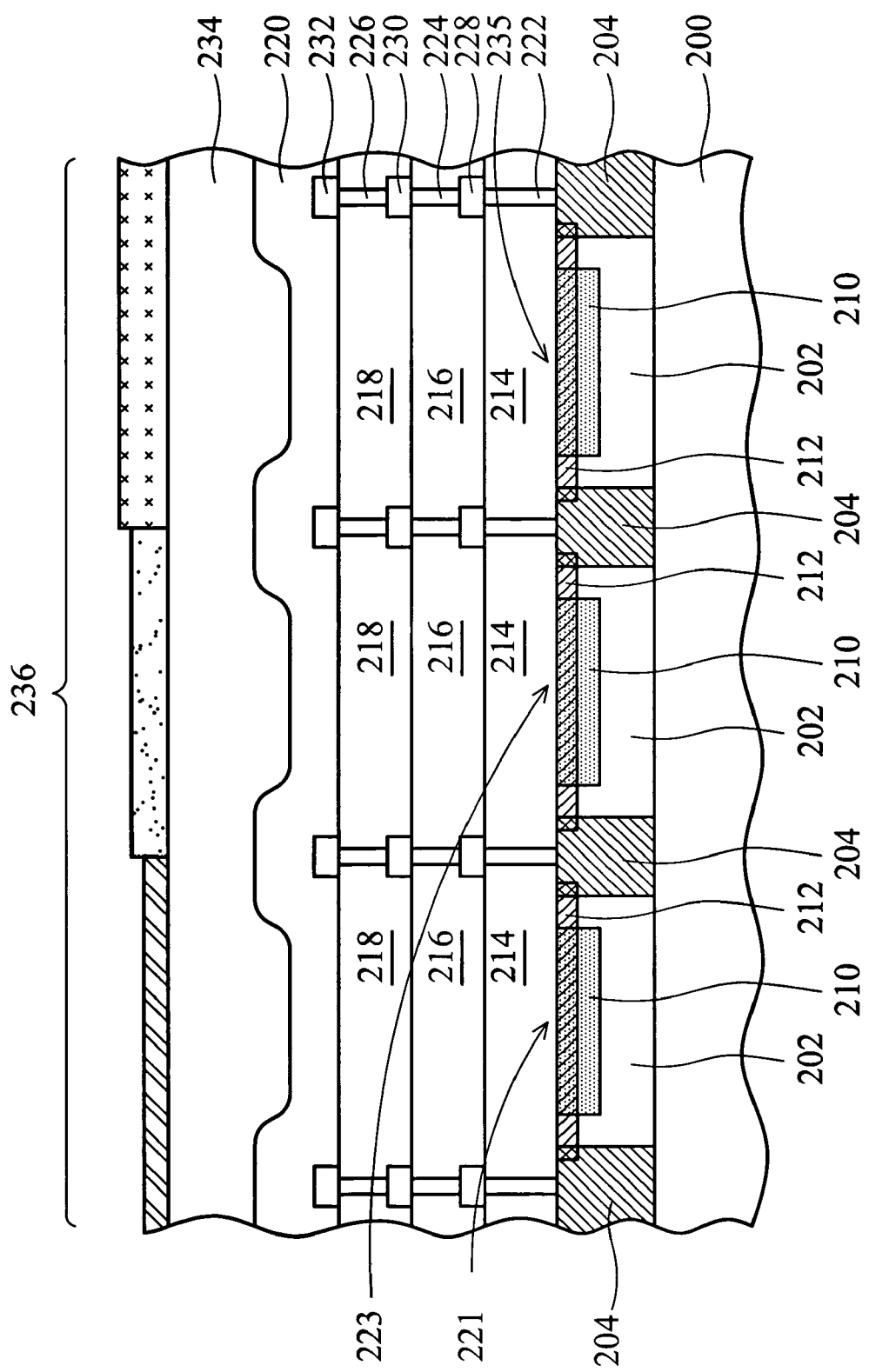
Figure 2G:
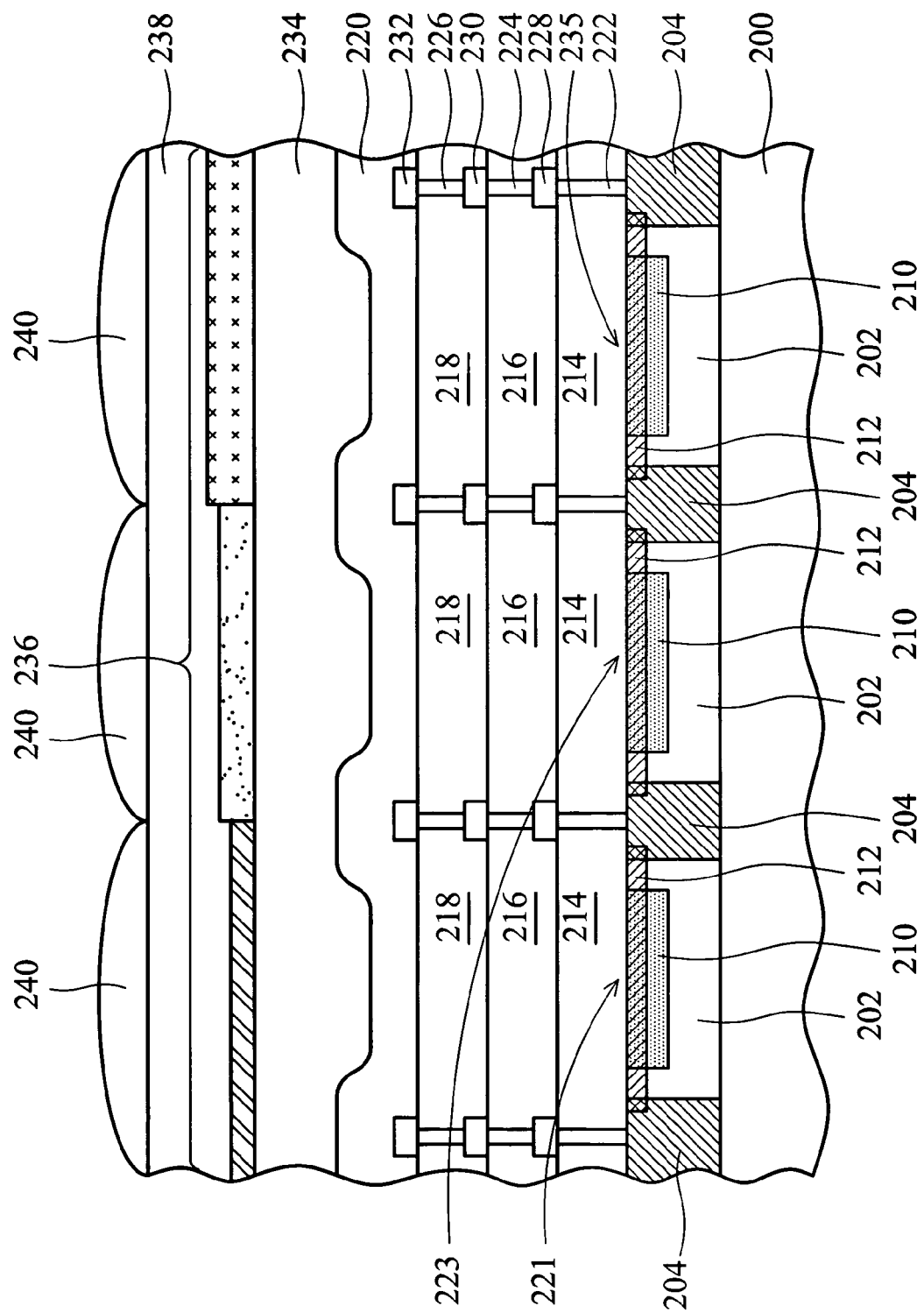

As shown in FIG. 2F, a first planarization layer 234 is formed on the passivation layer 220 to present a smooth surface. The first planarization layer 234 can be a thicker dielectric layer to obtain the smooth surface. Next, a color filter layer 236 is formed on the planarization layer 234. The color filter layer 236 can be patterned photoresist with three major colors. As shown in FIG. 2G, a second planarization layer 238, for example a thick TEOS layer, is formed on the color filter layer 236. Micro lenses 240 corresponding to each pixel are formed on the second planarization layer 238.

FIG. 2G is a cross section of a photo image sensing device of an embodiment of the invention. An active layer 202 is disposed overlying a substrate 200, wherein the active layer 202 presents different conductivity than the substrate 200. In an elementary example, the active layer 202 is P− epitaxy layer. The substrate 200 is P+ type. A plurality of photodiodes 221, 223 and 225 are disposed in the active layer 202. Each photodiode 202 comprises a doping region 210 with different doping type from the active layer 202 and the substrate 200 to form a depletion region therebetween, generating electrons when irradiated by incident light. For example, the doping region 210 can be N− type, unlike the P− type epitaxy layer 202 and P+ type substrate 200. An isolating region 204 interposed between two adjacent photodiodes contacts substrate 200. In a preferred embodiment of the invention, the isolating region 204 is a doped silicon, and more preferably of the same doping type as the substrate 200. For example, the isolating region can be P+ silicon.

A pinned layer 212 is disposed in the upper portion of the active layer 202 and adjacent to the upper surface thereof. The pinned layer 212 contacts or extends into the isolating region 204, presenting the same doping type as the isolating region 204. For example, the pinned layer 212 can be P+ type. The pinned layer 212, the isolating region 204, and the substrate 200 can be set of the same voltage level, and more preferably to ground to reduce dark current at the active layer 202 surface. Furthermore, transistors (not shown), controlling the photodiodes can be formed overlying the isolating region 204.

In an alternative embodiment of the invention, the layers or regions present different doping types from the embodiment described. For example, if the substrate 200 is N+, the active layer 202 is N−, the doping region 210 is P−, the isolating region 204 is N+, and the pinned layer 212 is N+.

In addition, the image sensing device in accordance with an embodiment of the invention further comprises a plurality of dielectric layers 214, 216 and 218 overlying the active layer 202, a passivation layer 220 overlying the dielectric layer 218, a first planarization layer 234 overlying the passivation layer 220, a color filter layer 236 overlying the first planarization layer 234, a second planarization layer 238 overlying the color filter layer 236, and a plurality of micro lenses 240 overlying the second planarization layer 238.

Figure 3:
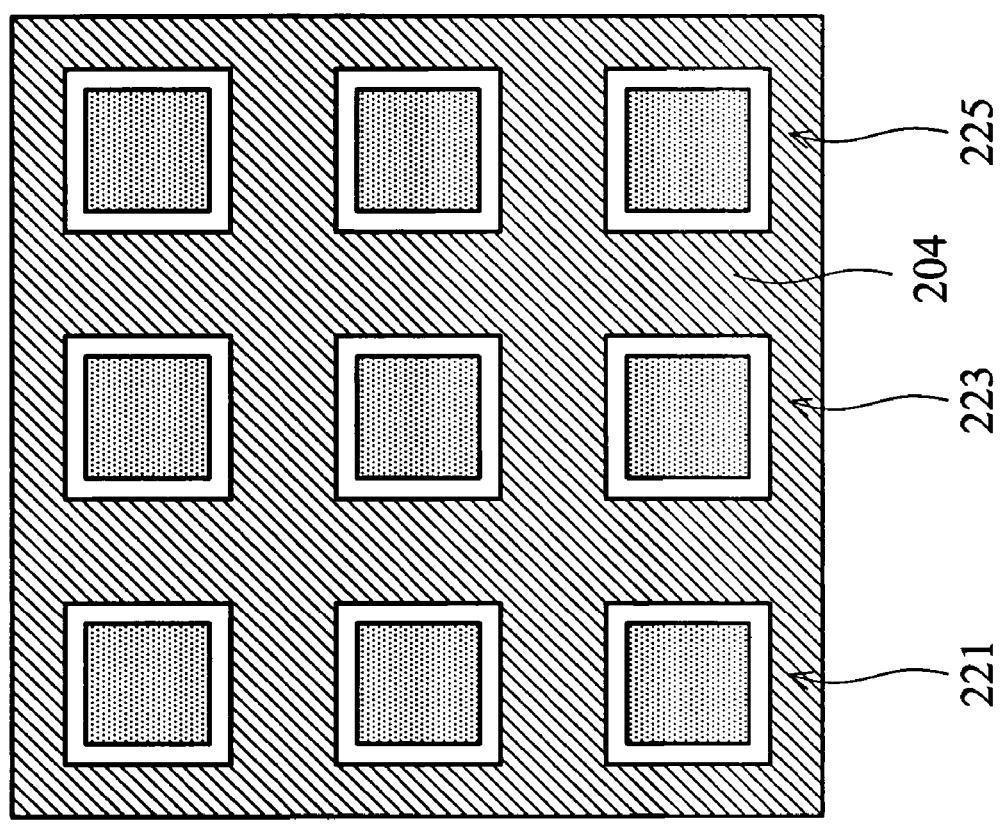
FIG. 3 is a top view of an image sensor of an embodiment of the invention.

FIG. 3 is a top view of an embodiment of the invention. Referring to FIG. 3, the isolating region 204, acting as a guard ring in the active layer, surrounds the photodiode 221, 223 or 225 to further eliminate dark current. The invention, however, is not limited thereto. The isolating region can surround the photodiode in any shape or form.

The isolating region in the active layer contacts or extends into the substrate having high concentration dopants or insulating layers to eliminate leakage current and crosstalk. In addition, the isolating region is spaced apart from the photodiode, such that dark signal due to misaligned photodiode is also eliminated.

While the invention has been described by way of example and in terms of the preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensing device, comprising:
    a substrate;
    an active layer overlying the substrate, wherein the active layer is an epitaxy layer;
    an isolating region formed by doping of the active layer to define a plurality of pixels, wherein the isolating region surrounds the pixels and extends into the substrate to isolate each pixel;
    a plurality of photodiodes disposed in the pixels; and
    a pinned layer in each pixel, wherein the pinned layer is adjacent to the upper surface of the active layer and extends into the isolating region.

2. The image sensing device according to claim 1, wherein the active layer has different conductivity from the substrate.

3. The image sensing device according to claim 1, wherein the isolating region is doped silicon of the same type as the substrate.

4. The image sensing device according to claim 1, wherein a doping concentration of the isolating region is about $10^{15} \sim 10^{17}$ atoms/cm$^3$.

5. The image sensing device according to claim 1, wherein:
    the substrate is P+ silicon;
    the isolating region is P+ silicon;
    the active layer is P− silicon; and
    the photodiodes are N− silicon.

6. The image sensing device according to claim 1, wherein:
    the substrate is N+ silicon;
    the isolating region is N+ silicon;
    the active layer is N− silicon; and
    the photodiodes are P− silicon.

7. The image sensing device according to claim 1, wherein a doping concentration of the substrate exceeds the isolating region, and a doping concentration of the isolating region exceeds the pinned layer.

8. The image sensing device according to claim 1, wherein the pinned layer, the isolating region and the substrate have the same voltage level.

9. The image sensing device according to claim 1, further comprising:
    at least one dielectric layer overlying the active layer;
    a passivation layer overlying the dielectric layer;
    a first planarization layer overlying the passivation layer;
    a color filter layer overlying the first planarization layer;
    a second planarization layer overlying the color filter layer; and
    a plurality of microlenses overlying the second planarization layer.

10. A method for forming an image sensing device, comprising:
    providing a substrate;
    forming an active layer on the substrate by epitaxy;
    doping the active layer to form a plurality of isolating regions, wherein the isolating regions extends into the substrate to isolate and define corresponding pixels;
    forming a doping region in each pixel to form a photodiode; and
    forming a pinned layer in each pixel, wherein the pinned layer is adjacent to the upper surface of the active layer and extends into isolating region.

11. The image sensing devices according to claim 10, wherein forming a plurality of isolating regions is accomplished by ion implantation.

12. The image sensing devices according to claim 10, wherein the active layer has different conductivity with the substrate.

13. An image sensing device, comprising:
    a substrate;
    an active layer overlying the substrate;
    an isolating region disposed in the active area to define a plurality of pixels, wherein the isolating region surrounds the pixels and contacts or extends into the substrate to isolate each pixel;
    a plurality of photodiodes disposed in the pixels; and
    a pinned layer in each pixel, wherein the pinned layer is adjacent to the upper surface of the active layer and extends into the isolating region.

14. The image sensing device according to claim 13, wherein a doping concentration of the substrate exceeds the isolating region, and a doping concentration of the isolating region exceeds the pinned layer.

15. The image sensing device according to claim 13, wherein the pinned layer, the isolating region and the substrate have the same voltage level.

* * * * *